(12) United States Patent
Ma et al.

(10) Patent No.: US 7,821,554 B2
(45) Date of Patent: Oct. 26, 2010

(54) IMAGE SENSOR WITH COOLING ELEMENT

(75) Inventors: Feng-Yang Ma, Taipei Hsien (TW);
Shao-Hung Wang, Taipei Hsien (TW)

(73) Assignee: Hon Hai Precision Industry Co., Ltd.,
Tu-Cheng, Taipei Hsien (TW)

( * ) Notice: Subject to any disclaimer, the term of this patent is extended or adjusted under 35 U.S.C. 154(b) by 444 days.

(21) Appl. No.: 11/964,793

(22) Filed: Dec. 27, 2007

(65) Prior Publication Data

US 2009/0046184 A1 Feb. 19, 2009

(30) Foreign Application Priority Data

Aug. 14, 2007 (CN) .................... 2007 1 0201355

(51) Int. Cl.
*H04N 5/335* (2006.01)

(52) U.S. Cl. ...................... 348/294; 348/374

(58) Field of Classification Search ................. 348/294, 348/374
See application file for complete search history.

(56) References Cited

U.S. PATENT DOCUMENTS 5,508,740 A * 4/1996 Miyaguchi et al. .......... 348/244
5,586,007 A * 12/1996 Funada ....................... 361/720
6,144,031 A * 11/2000 Herring et al. .............. 250/352
6,791,076 B2 9/2004 Webster
2003/0067544 A1* 4/2003 Wada ....................... 348/208.7
2004/0169771 A1* 9/2004 Washington et al. ......... 348/374
2006/0018644 A1* 1/2006 Stavely ........................ 396/55

FOREIGN PATENT DOCUMENTS

JP 2260658A A 10/1990

* cited by examiner

*Primary Examiner*—John M Villecco
*Assistant Examiner*—Kent Wang
(74) *Attorney, Agent, or Firm*—Jeffrey T. Knapp

(57) ABSTRACT

An image sensor includes a base an image sensor chip, and a cooling element. The base includes an opening disposed in the base. The image sensor chip is connected electrically to the base and covers the opening. The cooling element is received in the opening and is connected thermally to the image sensor chip. Heat produced by the image sensor chip can be dissipated in time by the cooling elements in the image sensor. The cooling elements maintain the image sensor chip works under a temperature no more than the rated working temperature of the image sensor chip and therefore extend the life of the image sensor, and improve the image quality of the image sensor chip.

6 Claims, 5 Drawing Sheets

IMAGE SENSOR WITH COOLING ELEMENT

RELATED FIELD

The present invention relates generally to image sensors, and more specifically to an image sensor having a heat-dissipating device.

BACKGROUND

Referring to FIG. 5, a conventional image sensor is shown. The image sensor includes a base 10, a sidewall 11, an image sensor chip 12, a number of bonding wires 13, a cover 14, and a number of adhesive 15. The base 10 includes a top surface 102, a bottom surface 104, a number of inner pads 101 disposed on the top surface 102, and a number of outer pads 103 disposed on the bottom surface 104. The image sensor chip 12 has a number of pads 121 and is mounted on the top surface 102 of the base 10 via the adhesive 15. The side wall 11 is mounted along the periphery of the top surface 102 of the base 10. The bonding wires 13 are configured for electrically connecting with the inner pads 101 of the base 10 and the pads 121 of the image sensor chip 12 to transmit signals produced by the image sensor chip 12. The cover 14 is attached to the sidewall 11 via the adhesive 15, covering the base 10 and the image sensor chip 12.

In the conventional image sensor, a lot of heat may be produced when the image sensor chip 12 works and an incident light reaches the image sensor chip 12. If the heat cannot be dissipated in time, the temperature of the image sensor chip 12 will rise beyond its rated temperature, which shortens the life of the image sensor chip 12 and degrades the quality of the image captured by the image sensor chip 12.

It is desired to provide an image sensor which can overcome the above-described deficiencies.

SUMMARY

In accordance with an exemplary embodiment, an image sensor includes a base an image sensor chip, and a cooling element. The base includes an opening defined therein. The image sensor chip is electrically connected to the base and covers the opening. The cooling element is received in the opening and is in thermally contact with the image sensor chip.

Other novel features and advantages will become more apparent from the following detailed description when taken in conjunction with the accompanying drawings.

BRIEF DESCRIPTION OF THE DRAWINGS

The present invention is described in detail hereinafter, by way of example and description of preferred and exemplary embodiments thereof and with reference to the accompanying drawings, in which.

DETAILED DESCRIPTION OF THE PREFERRED EMBODIMENTS

A detailed explanation of an image sensor according to each of various embodiments of the present invention will now be made with reference to the drawings attached hereto.

Figure 1:
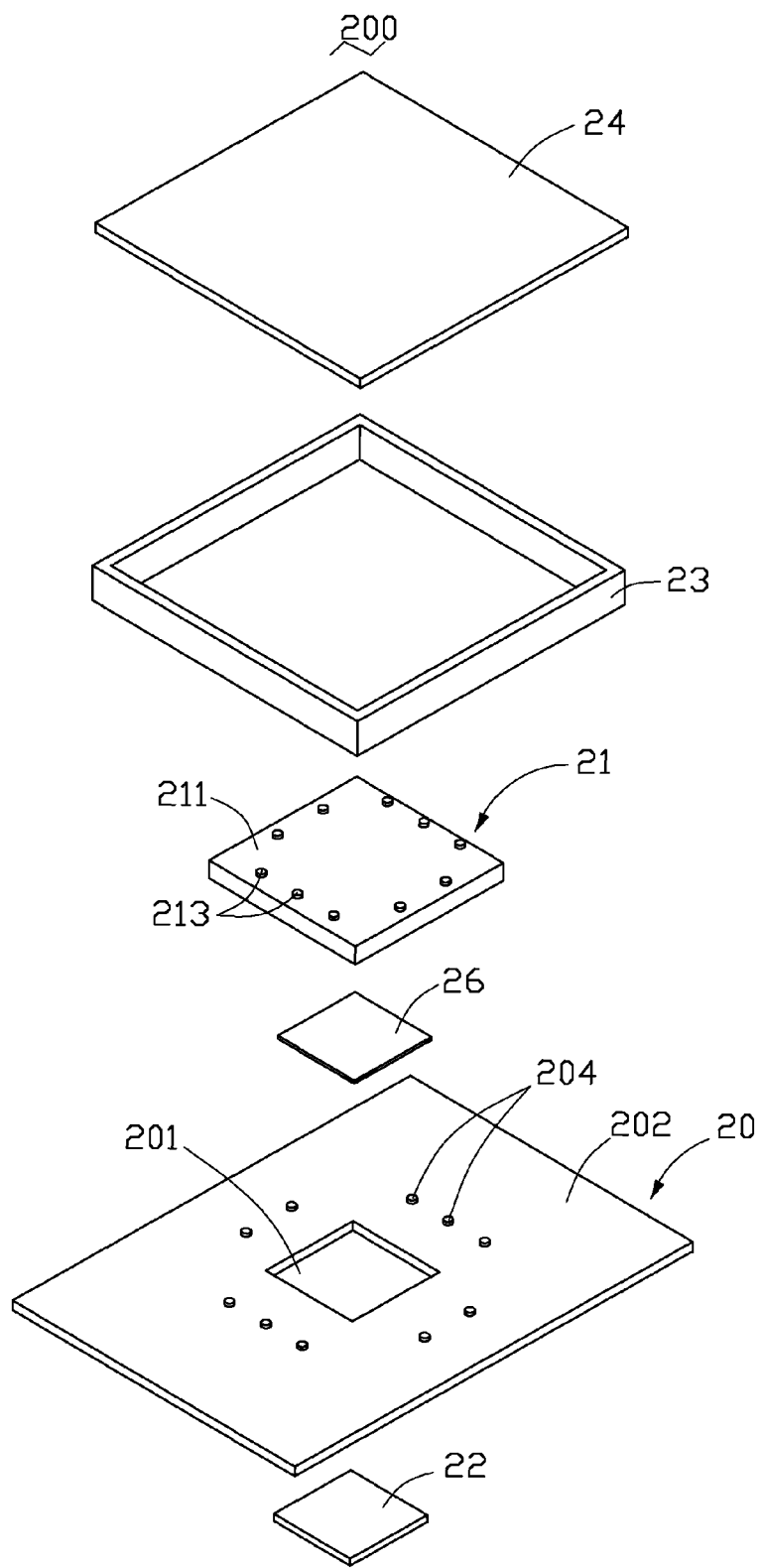
FIG. 1 is an exploded, isometric view of an image sensor in accordance with a first embodiment of the present invention.
Figure 2:
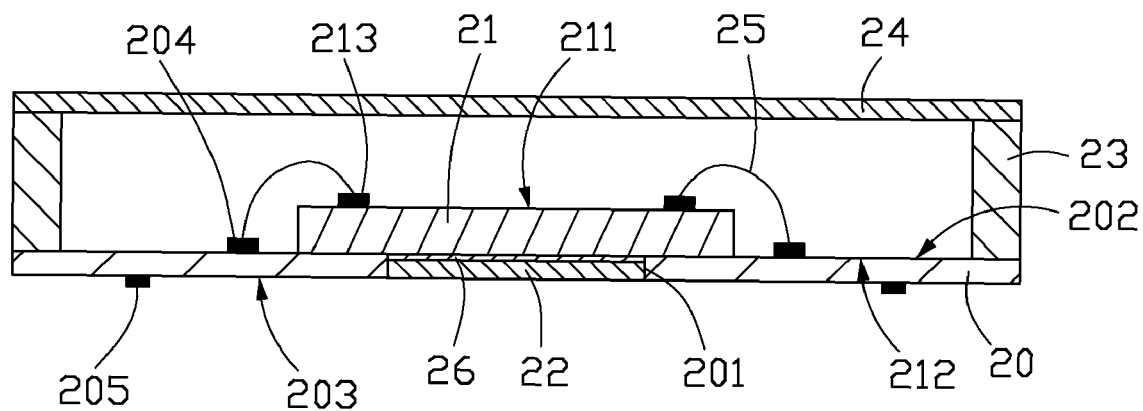
FIG. 2 is a cross-sectional view of an assembly of the image sensor of FIG. 1.

Referring to FIG. 1 and FIG. 2, an image sensor 200 according to a first embodiment of the present invention is shown. The image sensor 200 includes a base having an opening 201 defined therein, an image sensor chip 21, a cooling element 22, a sidewall 23, a cover 24, a number of bonding wires 25, and a connector 26.

The base 20 is made of a material such as plastic, ceramic, or fiber. The base 20 defines a top face 202 thereon, a bottom face 203 formed opposite to the top face 202, a number of inner pads 204 and a number of outer pads 205. The inner pads 204 are circumferentially arranged at the periphery of the opening 201. The outer pads 205 are circumferentially arranged at the periphery of the bottom face 203 leaving a usable area of the bottom face 203 for heat dissipation. The size of the opening 201 in the center portion of the base 20 is substantially less than that of the image sensor chip 21. The shape of the opening 201 can be square, circular, or the like. In the present embodiment, the opening 201 is a square through-hole.

The image sensor chip 21 configured for capturing images has a photosensitive area 211 on a middle portion thereof and a number of welding pads 213 formed therearound. The image sensor chip 21 is adhered to the top face 202 of the base 20 and covers the opening 201 of the base 20. In particular, the center axis of the image sensor chip 21 is aligned with that of the opening 201. The welding pads 213 are electrically connected to the inner pads 204 via the bonding wires 25 to transmit signals captured by the image sensor chip 21 to the base 10 and the signals are also transmitted to a printed circuit board (not shown) via the outer pads 205.

The cooling element 22 is received in the opening 201 and thermally connected to the image sensor chip 21 via the connector. The shape of the cooling element 22 is optional. The cooling element 22 is made of copper or aluminum. In the present embodiment, the cooling element 22 is made of copper and an area of the cooling element 22 is same as that of the opening 201.

The connector 26 can be a silicone pad or a thermal pad. In the present embodiment, the connector 26 is a thermal pad, which is configured for fixing the cooling element 22 to the image sensor chip 21.

The sidewall 23 is made of resin that is shaped to form an enclosure to enclose the image sensor chip 21. The height of the sidewall 23 is substantially greater than that of the image sensor chip 21. The shape of the sidewall 23 corresponds to that of the base 10. The sidewall 23 is fixed to the top face 202 of the base 20 via adhesive (not shown). It should be understood that the sidewall is may or may not be integrally formed with the base 20.

The cover 24 is made of a transparent material, such as glass or resin, and is adhered to a top end of the sidewall 23 via adhesive. Thus, the cover 24 and the sidewall 23, together with the base 20 cooperatively define a sealed receiving chamber (not labeled) for receiving the image sensor chip 21 therein.

Figure 3:
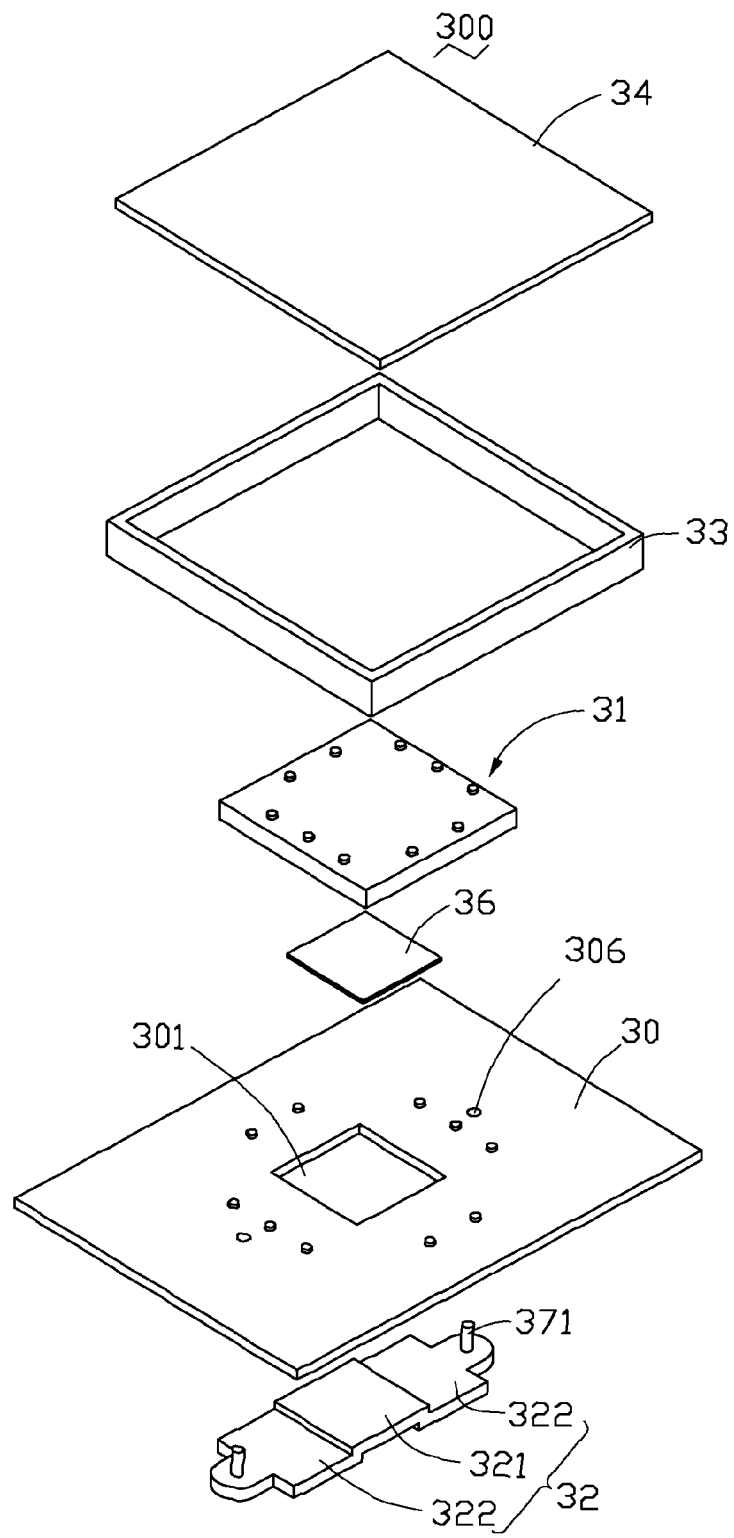
FIG. 3 is an exploded, isometric view of an image sensor in accordance with a second embodiment of the present invention.
Figure 4:
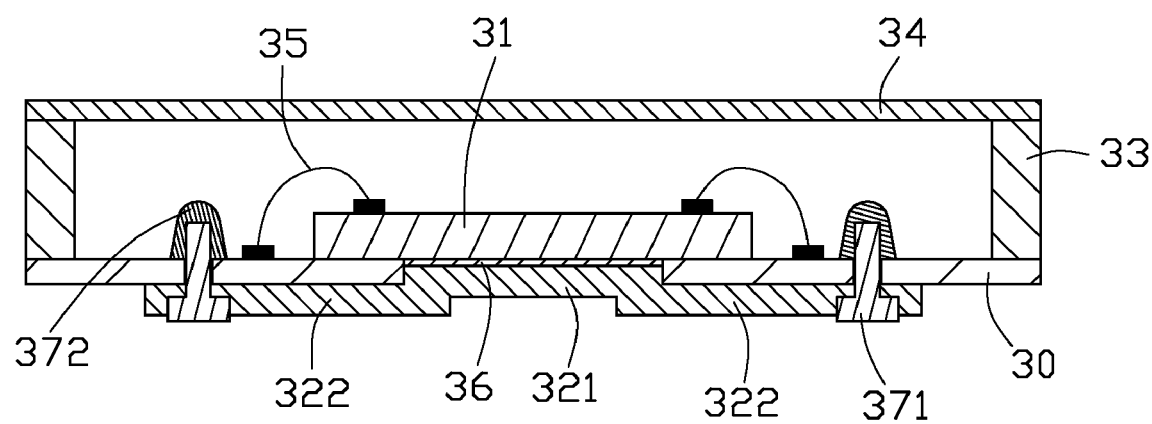
FIG. 4 is a cross-sectional view of an assembly of the image sensor of FIG. 3.
Figure 5:
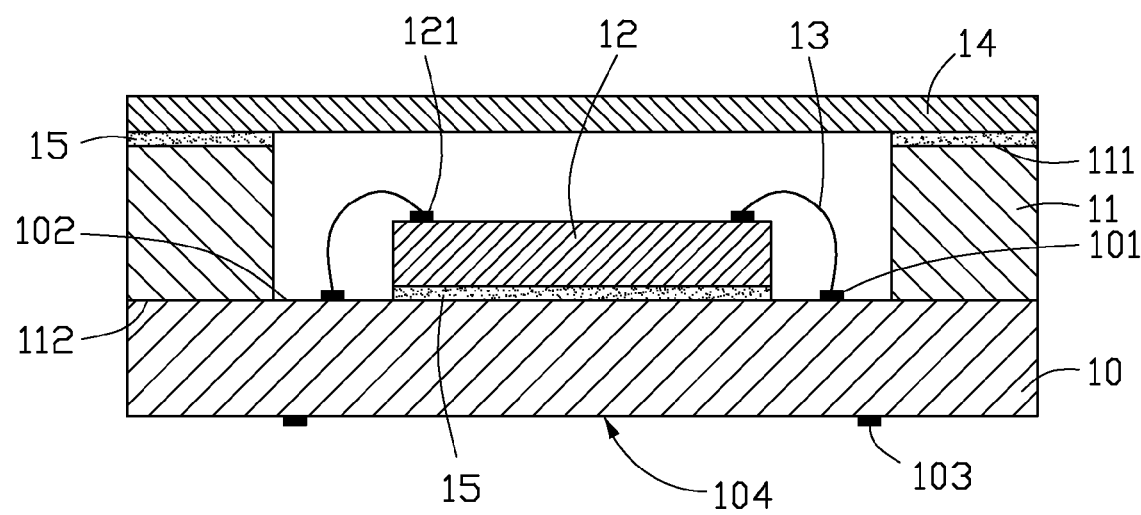
FIG. 5 is a cross-sectional view of a conventional image sensor.

Referring to FIG. 3 and FIG. 4, an image sensor 300 according to a second embodiment of the present invention is shown. The image sensor 300 includes a base 30 having a opening 301, an image sensor chip 31, a cooling element 32, a sidewall 33, a cover 34, a number of bonding wires 35, and a connector 36.

Difference between the first embodiment and the second embodiment is that the cooling element 32 can be a board and includes a raised portion 321 and at least a side lower portion at a side of the raised portion 321. In the second embodiment, the cooling element 32 has two side lower portions 322 disposed at opposite sided of the raised portion 321 respectively. The raised portion 321 is in thermally contact with the image sensor chip 31 via the connector 36 and received in the opening 301. The two side lower portions 322 are integrally formed with the raised portion 321 and configured for extending a heat-dissipating area of the cooling element 32.

In alternative embodiments, in order to firmly fix the two side lower portions 322, at least a pin 371 is disposed in the side lower portions 322. In the present embodiment, two pins 371 are respectively disposed in the two side lower portions 322. Corresponding to the pins 371, two pin holes 306 are defined in the base 30 and configured for receiving the two pins 371. In particular, soldering tins 372 are welded on the portions of the two pins 371 which protrude from the base 30 in order to further fix the side lower portions 322.

Heat produced by the image sensor chip can be timely dissipated by the cooling elements in the image sensors 200, 300. The cooling elements keep the image sensor chip working at a temperature no more than the rated working temperature of the image sensor chip and therefore extend the life of the image sensor chip, and improve the image quality of the image sensor chip.

It should be understood that the above-described embodiment are intended to illustrate rather than limit the invention. Variations may be made to the embodiments without departing from the spirit of the invention. Accordingly, it is appropriate that the appended claims be construed broadly and in a manner consistent with the scope of the invention.

What is claimed is:

1. An image sensor, comprising:
   a base comprising an opening defined therein;
   an image sensor chip electrically connected to the base and covering the opening;
   a cooling element received in the opening and in thermal contact with the image sensor chip;
   wherein the cooling element comprises a raised portion and two side lower portions disposed at opposite sides of the raised portion.

2. The image sensor as claimed in claim 1, wherein the raised portion is integrally formed with the side lower portion.

3. The image sensor as claimed in claim 1, wherein the cooling element comprises at least a pin disposed in the side lower portion and configured for fixing the side lower portion to the base.

4. The image sensor as claimed in claim 1, wherein the cooling element is made of copper.

5. The image sensor as claimed in claim 1, wherein the cooling element is made of aluminum.

6. The image sensor as claimed in claim 1, wherein the base is a printed circuit board.

* * * * *